(12) United States Patent
Han et al.

(10) Patent No.: US 10,559,768 B2
(45) Date of Patent: Feb. 11, 2020

(54) ADHESIVE AND FLEXIBLE DISPLAY USING THE SAME

(71) Applicant: LG DISPLAY CO., LTD., Seoul (KR)

(72) Inventors: Mi-Jin Han, Gimpo-si (KR); Seung-Hee Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/113,694

(22) Filed: Aug. 27, 2018

(65) Prior Publication Data

US 2019/0067606 A1 Feb. 28, 2019

(30) Foreign Application Priority Data

Aug. 31, 2017 (KR) .......................... 10-2017-0111156

(51) Int. Cl.
*H01L 51/52* (2006.01)
*H01L 51/00* (2006.01)

(52) U.S. Cl.
CPC ...... *H01L 51/0097* (2013.01); *H01L 51/5237* (2013.01); *H01L 2251/5338* (2013.01)

(58) Field of Classification Search
CPC .. H01L 51/52; H01L 51/5237; H01L 51/0097
See application file for complete search history.

(56) References Cited

U.S. PATENT DOCUMENTS

| 8,053,331 | B2 | 11/2011 | Gadkaree | |
|---|---|---|---|---|
| 2014/0295150 | A1* | 10/2014 | Bower | C09J 5/00 428/201 |
| 2015/0004345 | A1* | 1/2015 | Chaung | B32B 7/14 428/41.7 |
| 2015/0043174 | A1 | 2/2015 | Han et al. | |
| 2015/0086740 | A1 | 3/2015 | Shin et al. | |
| 2016/0009956 | A1* | 1/2016 | Hwang | C09J 133/08 428/41.8 |
| 2016/0303843 | A1* | 10/2016 | Jang | B32B 37/0084 |
| 2016/0338219 | A1* | 11/2016 | Seo | G06F 1/1652 |
| 2017/0263891 | A1* | 9/2017 | Oh | H01L 25/18 |
| 2018/0062090 | A1* | 3/2018 | Kim | H01L 27/3276 |

FOREIGN PATENT DOCUMENTS

| CN | 104423696 A | 3/2015 |
|---|---|---|
| JP | 2013-11893 A | 1/2013 |
| KR | 10-2014-0143979 A | 12/2014 |
| KR | 10-2015-0108990 A | 10/2015 |
| KR | 10-2016-0076665 A | 7/2016 |
| KR | 10-2016-0082394 A | 7/2016 |
| KR | 10-2016-0144912 A | 12/2016 |
| KR | 10-2017-0015599 A | 2/2017 |
| KR | 10-2017-0029162 A | 3/2017 |
| KR | 10-2017-0064161 A | 6/2017 |
| TW | 201704779 A | 2/2017 |

* cited by examiner

*Primary Examiner* — Fazli Erdem
(74) *Attorney, Agent, or Firm* — Birch, Stewart, Kolasch & Birch, LLP

(57) ABSTRACT

A patterned adhesive can prevent detachment and easily return to an original state even during repeated folding operations, and a flexible display including the same are discussed. The patterned adhesive includes a patterned adhesive layer so that it can easily return to an original state by formation of a plurality of neutral planes upon compression and extension through a folding operation.

17 Claims, 10 Drawing Sheets

Neutral plane

Neutral plane

ADHESIVE AND FLEXIBLE DISPLAY USING THE SAME

This application claims the priority benefit of Korean Patent Application No. 10-2017-0111156, filed on Aug. 31, 2017 in the Republic of Korea, which is hereby incorporated by reference as if fully set forth herein.

BACKGROUND OF THE INVENTION

Field of the Invention

The present invention relates to a flexible display, and more particularly, to an adhesive which can prevent detachment at the interface with an adhesive layer and can easily return to the original state even during repeated folding operations by including a plurality of neutral planes based on a change in the inner configuration, and to a flexible display including the adhesive.

Discussion of the Related Art

Image displays for displaying a variety of information on a screen are core technologies in the information-technology era and are being developed into slimmer, lighter weight and higher-functional forms. In response to these requirements, organic light emitting diodes and the like, which are capable of spontaneously emitting light and thus do not require a separate light source unit, attract much attention, as flat panel display devices capable of reducing weight and volume, which are the drawbacks of cathode ray tubes.

Organic light emitting displays display an image through a plurality of pixels arranged in the form of a matrix. Each pixel includes a light emitting element and a pixel driving circuit including a plurality of transistors independently operating the light emitting element.

Meanwhile, recently in terms of various applications, there is an increasing demand for a flexible display that can be easily carried in a pocket or a small pouch and can display an image on a screen larger than a portable display. Flexible displays are folded or bent partly when carried or stored, and are opened when displaying an image, so that an image display area can be increased and a more realistic image can be seen better to a user.

A display panel on which an image is displayed can be slimmed by decreasing the thickness of a substrate.

In addition, a flexible display includes a back plate disposed under a foldable or bendable flexible display panel to support the display panel and mount the same in a case. The display panel and the back plate are produced through different processes and can be bonded together via an adhesive interposed therebetween because both the display panel and the back plate have no adhesive property.

In this regard, general adhesives have a problem of not suitably responding to folding or bending of display panels because, after heat-setting or photo-setting, they remain set. In addition, when an adhesive is made of a material having similar flexibility as the display panel or the back plate by controlling the rigidity thereof, there is a problem in that the adhesive exerts adhesion only on the surface where the display panel contacts the back plate so that they can contact via a high attractive force, but opposite surfaces of the adhesive are deformed due to different attractive forces during an operation such as folding.

Hereinafter, a folding state of a flexible display according to Comparative Example will be described.

FIG. 1 is a sectional view illustrating a folding state of a flexible display according to Comparative Example.

As shown in FIG. 1, the flexible display according to Comparative Example includes a display panel 10 and a back plate 20 which are bonded together via an adhesive 15 interposed between the entire surfaces thereof. In this case, when the flexible display is folded in half, the display panel 10 folded inside and the back plate 20 folded outside have different radiuses of curvature in the folding region. Accordingly, the display panel 10 and the back plate 20 overlap while having the same size in a non-folding state. On the other hand, in a folding state, the display panel 10 and the back plate 20 extend while having different radiuses of curvature in a folding region, and an area where the back plate 20 having a larger radius of curvature does not overlap the display panel 10, corresponding to the extension, in a non-folding region of both ends, is formed.

In addition, during such a folding operation, a first surface and a second surface of the adhesive 15, which contact the display panel 10 and the back plate 20, respectively, have a strain "m" at opposite ends due to the difference between the adhesive surfaces. A sum of strains "2m" at the two ends is defined as a difference in the folding length between the first surface and the second surface of the adhesive 15.

When the distance (radius of curvature) from the center of the folding region of the display panel 10 to the first surface of the adhesive 15 is set to "R", the folding region has a semicircular cross-sectional surface. For this reason, the length of the folding region on the first surface contacting the display panel 10 corresponds to "nR". In addition, when the thickness of the adhesive 15 is set to "d", the length of the folding region on the second surface contacting the adhesive 15 corresponds to "n(R+d)". Accordingly, the following equation for the sum of strains "2m" is obtained:

$$2m = \pi(R+d) - \pi R.$$

Unless the adhesive 15 is interposed over the entire surface between the display panel 10 and the back plate 20, and has similar flexibility to the display panel 10 or the back plate 20, like the flexible display according to Comparative Example, when the folded flexible display is opened (unfolded) again, it is difficult for the adhesive 15 to return to the original state. In this case, it takes a long time for the display to return to the original state or it is impossible to unfold the folding region and thus return to the original flat flexible display.

Meanwhile, the aforementioned entire-surface-type adhesive according to the flexible display of Comparative Example can easily return to the original state by improving the rigidity thereof. However, when the rigidity of the adhesive is excessively strong, disadvantageously, the display panel can crack upon repetition of folding and unfolding operations due to the increased stress applied to the relatively flexible display panel. In addition, an entire-surface-type adhesive with reduced rigidity takes an excessively long time from a time at which the strain "2m" occurs until returning to the original state, despite being unfolded, after folding. An adhesive property is deteriorated at the interface between the display panel contacting the adhesive, and the back plate, thus being disadvantageously inapplicable to display devices.

SUMMARY OF THE INVENTION

Accordingly, the present invention is directed to an adhesive and a flexible display including the same that substantially obviate one or more problems due to limitations and disadvantages of the related art.

An object of the present invention is to provide an adhesive which is capable of reducing stress applied to a display panel during folding and easily returning to the original state after folding by changing the shape of the adhesive, and to a flexible display including the same.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, provided is a patterned adhesive, wherein the patterned adhesive is compressively deformed in response to an operation of an adherend to be folded, so that the patterned adhesive can easily return to an original state by formation of a plurality of inner neutral planes upon deformation.

The adhesive interposed between a first adherend and a second adherend facing each other can include a strain layer including a plurality of spaced-apart divided strain layers, and a first adhesive layer having a first surface contacting the strain layer and a second surface contacting the first adherend.

In addition, the first adhesive layer can be integrated with the first adherend, while having the same size as the first adherend corresponding to the second surface.

Alternatively, the first adhesive layer can be divided into a plurality of portions, and each first surface of the divided portions of the first adhesive layer has the same size as each top surface of the plurality of spaced-apart divided strain layers.

In addition, the adhesive can further include a second adhesive layer disposed between the strain layer and the second adherend.

Each of the spaced-apart divided strain layers can be a polygon having the top surface, a bottom surface having an identical shape to the top surface and facing the second adherend, and a height between the top surface and the bottom surface, wherein the top surface and the bottom surface have a first side along the folding axis and a second side crossing the first side, and the height is longer than the second side, and a distance between second sides of adjacent two spaced-apart divided strain layers is larger than or equal to a length of the second side.

In addition, the strain layer can have a modulus of $1.0 \times 10^5$ Pa to $9.0 \times 10^7$ Pa.

In addition, the strain layer can include a rubber resin, and the first adhesive layer and the second adhesive layer can include a binder resin.

In another aspect of the present invention, provided is a flexible display including a display panel including a thin film transistor, an organic light emitting diode array, and a sealing layer for sealing the thin film transistor and the organic light emitting diode array, a back plate facing the display panel, and the patterned adhesive mentioned above provided between the display panel and the back plate.

The back plate can include a plurality of openings in a folding region.

The patterned adhesive can include spaced-apart divided strain layers in the folding region of the back plate, and an integrated strain layer in a non-folding region of the back plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
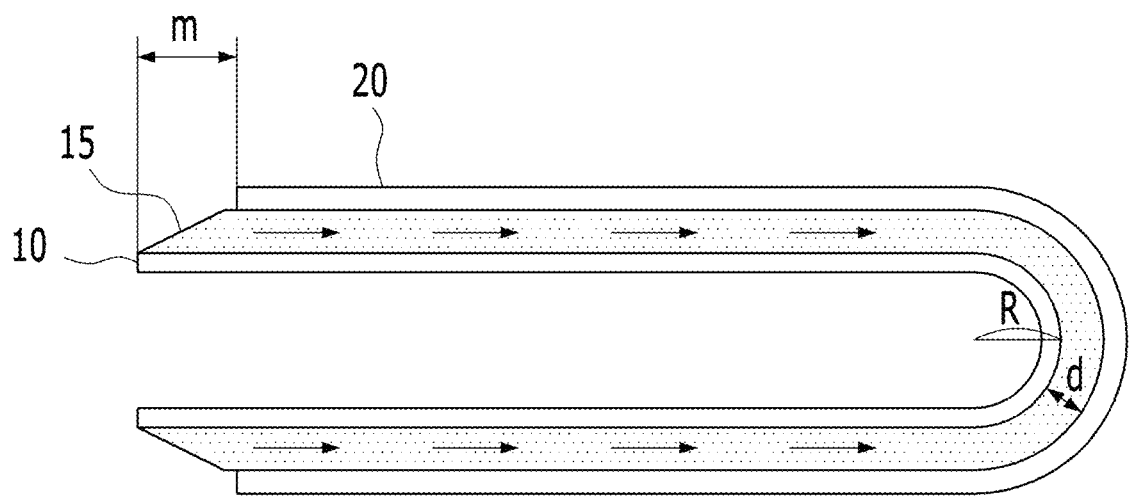
FIG. 1 is a sectional view illustrating a folding state of a flexible display according to Comparative Example.

Reference will now be made in detail to the preferred embodiments of the present invention, examples of which are illustrated in the accompanying drawings. In the following description of the present invention, substantially the same elements are denoted by the same reference numerals. In the following description, when detailed description of well-known technologies or configurations relating to the present invention are deemed to unnecessarily make the subject matter of the present invention unclear, detailed explanation thereof will be omitted. In addition, names of constituent components used in the following description can be different from part names of actual products because they are selected in consideration of convenient drafting of the specification.

In the following description of the present invention, the same or similar elements are denoted by the same reference numerals even though they are depicted in different drawings.

In addition, in the description of embodiments, it will be understood that, when one element or layer is referred to as being "on" or "above" another element or layer, one element can directly contact the other element or layer, or one or more intervening elements or layers can also be present between the two elements or layers. In addition, when one element or layer is referred to as "contacting" another element, one or more intervening elements are not present between the two elements or layers.

The sizes and thicknesses of respective elements are illustrated in the drawings for convenience of description and the present invention is necessarily not limited to the sizes and thicknesses thereof.

Hereinafter, preferred embodiments of the present invention will be described with reference to the annexed drawings.

The display illustrated in the following embodiments represents a foldable display, but a folding region can be located in any part of the display. In the flexible display according to the present invention, the location of deformation of a lower plate and a magnetic material in the folding region can be changed depending on change of the folding region of the display. In addition, the flexible display according to the present invention can also be called "foldable", "bendable", "rollable" or the like so long as it is flexible.

Figure 2:
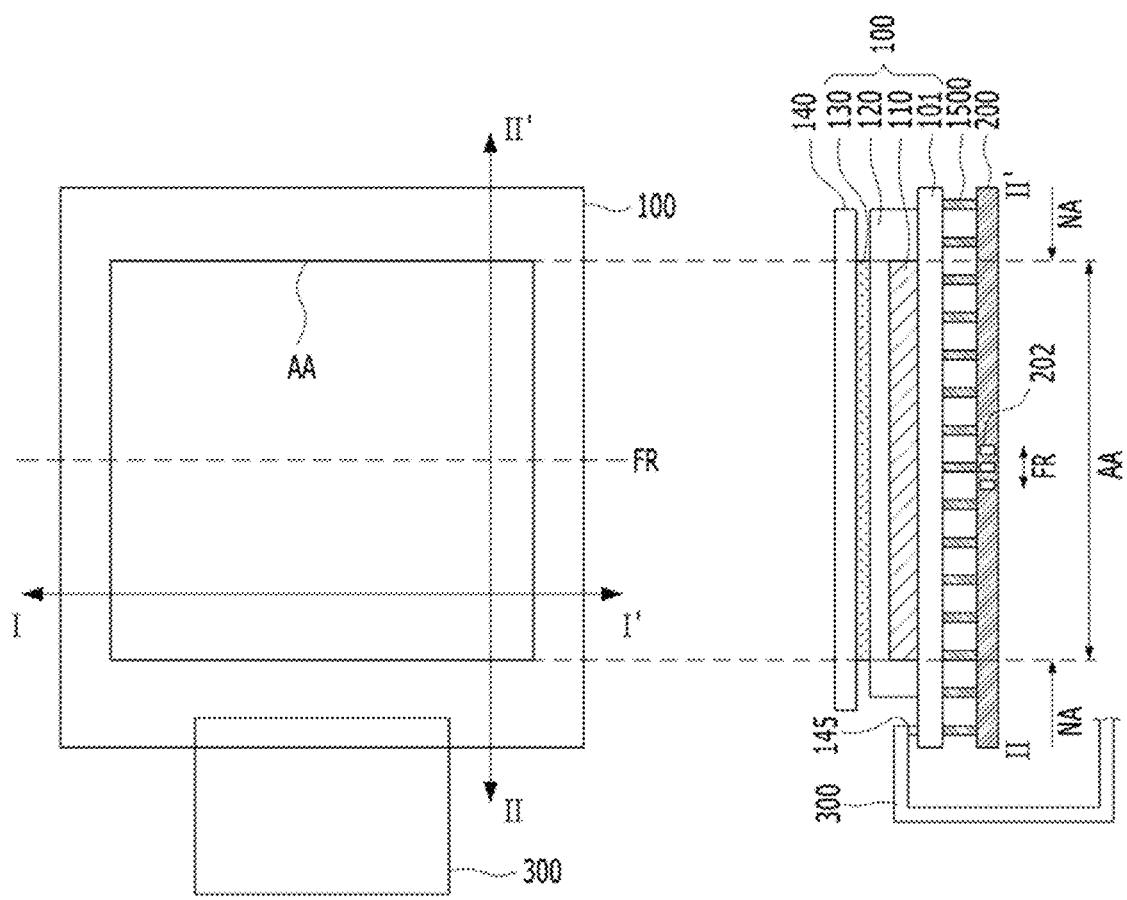
FIG. 2 shows a flexible display according to an embodiment of the present invention.
Figure 2:
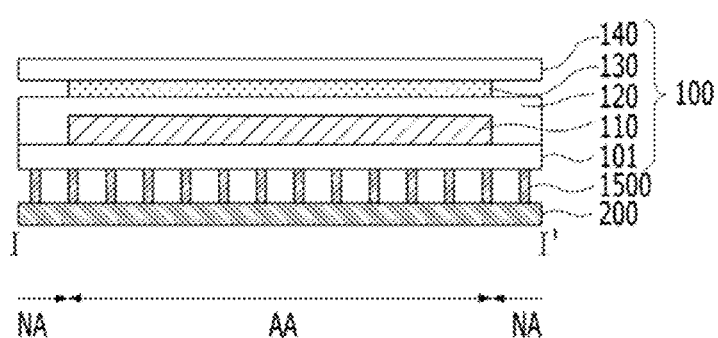

FIG. 2 shows a flexible display according to an embodiment of the present invention. All the components of the flexible display according to all embodiments of the present invention are operatively coupled and configured.

As shown in FIG. 2, the flexible display according to the present invention includes a display panel 100, a back plate 200 which faces the display panel 100 and supports the bottom of the display panel 10, and a patterned adhesive 1500 interposed between the display panel 100 and the back plate 200.

The patterned adhesive 1500 includes a strain layer having elasticity which includes a plurality of predetermined patterns which are spaced from one another by a constant distance. Accordingly, when the display panel 100 and the back plate 200 are folded along a folding region (FR) in the direction of the line "I~I", the patterned strain layer can be compressively deformed according to curvature during folding.

Meanwhile, the display panel 100 of the flexible display according to the present invention includes an active area AA which includes a plurality of pixels in the center of the display panel 100 and a non-display area NA which surrounds the periphery of the active area AA.

In addition, the display panel 100 includes a substrate 101, an array 110 including a thin film transistor and an organic light emitting diode in each sub-pixel provided in the active area AA, a sealing layer 120 which seals the thin film transistor and the organic light emitting diode, a touch electrode array 130 provided on the sealing layer 120, and a cover layer 140 which protects the touch electrode array 130.

The substrate 101 and the cover layer 140 can be a thin glass or plastic film which has a thickness of 0.2 mm or less and can be flexibly changed in shape without cracking even upon folding. In addition, the substrate 101 and the cover layer 140 can be made of different materials in consideration of light-emission direction and heat-resistance in the process of forming the array 110. When light is emitted upward, the cover layer 140 can be made of a transparent polymer and the substrate 101 can be made of colorful polyimide.

In addition, the array 110 includes a plurality of layers, i.e., an insulation layer, a metal layer and a semiconductor layer, formed on the substrate 101, and each layer has a small thickness of 5,000 Å or less and thus is neither deformed nor cracked even upon folding.

In addition, the sealing layer 120 has a thin film laminate which is formed by alternately stacking an organic film and an inorganic film and sufficiently covers the top of as well as the side surfaces of the active area AA-provided array 110 to prevent exterior humidity or air from permeating into the array 110. That is, the sealing layer 120 is formed on the substrate 101 with a size larger than the active area AA, over the edge of the substrate 101, excluding a side at which the pad electrode 145 is provided. In addition, the thicknesses of the organic film and the inorganic film provided in the sealing layer 120 are 3 μm or less and 1 μm or less, respectively, the total thickness of the sealing layer 120 does not exceed about 20 μm, and the uppermost part of the sealing layer 120 can be subjected to planarization due to the relatively thick organic film.

In addition, a touch electrode array 130 is directly formed on the surface of the flat uppermost part of the sealing layer 120 or an additional inorganic protective film is further provided thereon, so that the touch electrode array 130 can be provided. In some cases, after the touch electrode array 130 is formed on the inner surface of the cover layer 140, it can be attached to the surface of the sealing layer 120.

In addition, the substrate 101 can include a pad part having one side exposed from the sealing layer 120, a plurality of pad electrodes 145 are disposed in the pad part and the pad electrodes 145 are connected to a flexible printed circuit board 300. In addition, the flexible printed circuit board 300 is folded toward the bottom of the substrate 101 and is finally accommodated in the structure of a cover bottom.

The cross-sectional view taken along the line "II~II" of FIG. 2 shows that the flexible printed circuit board 300 is folded toward the bottom of the substrate 101 and the back plate 200.

Meanwhile, although the back plate 200 having a similar thickness to the substrate 101 is shown in FIG. 2, the back plate 200 is an element which supports a lower part of the substrate 101, includes a metal as a main ingredient and has a thickness which is equal to or higher than that of the entire thickness of the display panel 100. In addition, since the back plate 200 has a higher rigidity than the display panel 100 due to metal material and a high thickness, it is provided with a plurality of openings 202 in the folding region (FR), so that the areas provided with the openings 202 serve as springs, making folding easier.

In addition, a skin layer is provided in upper and lower parts of a core layer which includes the openings 202 of the back plate 200, so that a step can be compensated and the inner core layer can be protected from exterior shock. As shown in the drawing, the core layer excluding the openings 202 and the skin layer provided in upper and lower parts thereof are integrated. However, the core layer is a rigid metal layer, whereas the skin layer is a resin film or inorganic insulation film, which means that the core layer and the skin layer are made of different materials.

Meanwhile, in the flexible display according to the embodiments of the present invention, the patterned adhesive 1500 is disposed between the display panel 100 and the back plate 200 as adherends which provide surfaces to which the patterned adhesive 1500 adheres. The patterned adhesive 1500 has a strain layer compressively deformed by pressure or attraction, which is made of a rubber resin.

For example, the rubber resin can include a polybutadiene (PB) resin, a polyisobutylene (PIB) resin, a polypentadiene resin, a polyisoprene resin, a polyneoprene resin, styrene-butadiene rubber (SBR), acrylonitrile-butadiene rubber (NBR), an acrylonitrile-butadiene-styrene (ABS) resin, acrylate-butadiene rubber (ABR), ethylene-propylene rubber, ethylene-propylene-diene rubber, a combination thereof and a copolymer thereof.

In addition, the rubber resin can have a diene structure.

Although the patterned adhesive 1500, which is interposed in the form of a plurality of one kind of separate parts, which are spaced from one another, between both adherends (e.g., the display panel 100 and back plate 200), is shown in FIG. 2, the patterned adhesive 1500 can take other shapes. In the embodiments of the present invention, one of the display panel 100 and back plate 200 is used as a first adherend and the other is used as a second adherend to the patterned adhesive 1500.

Figure 3A:
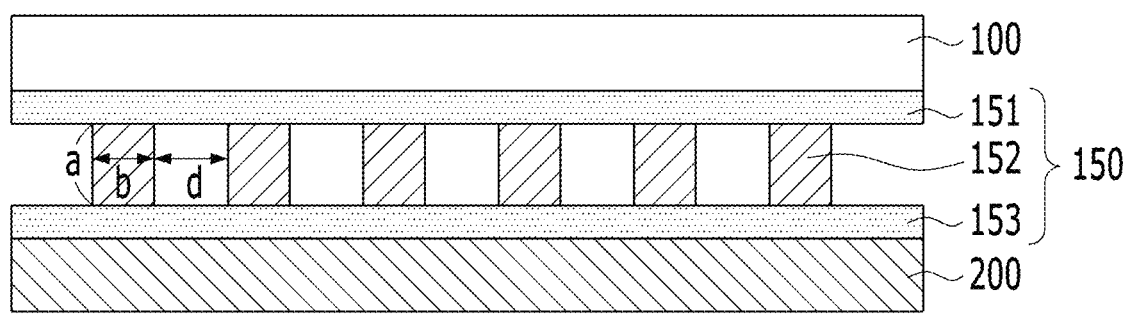
FIGS. 3A to 3C are sectional views illustrating flexible displays to which various shapes of patterned adhesive according to examples of the present invention are applied.
Figure 3B:
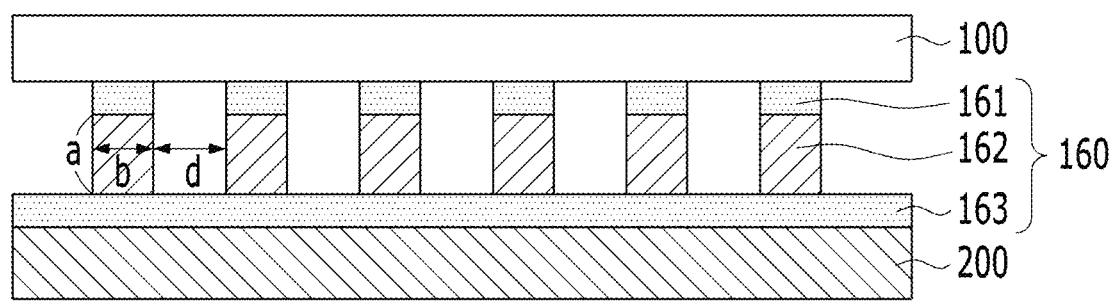
Figure 3C:
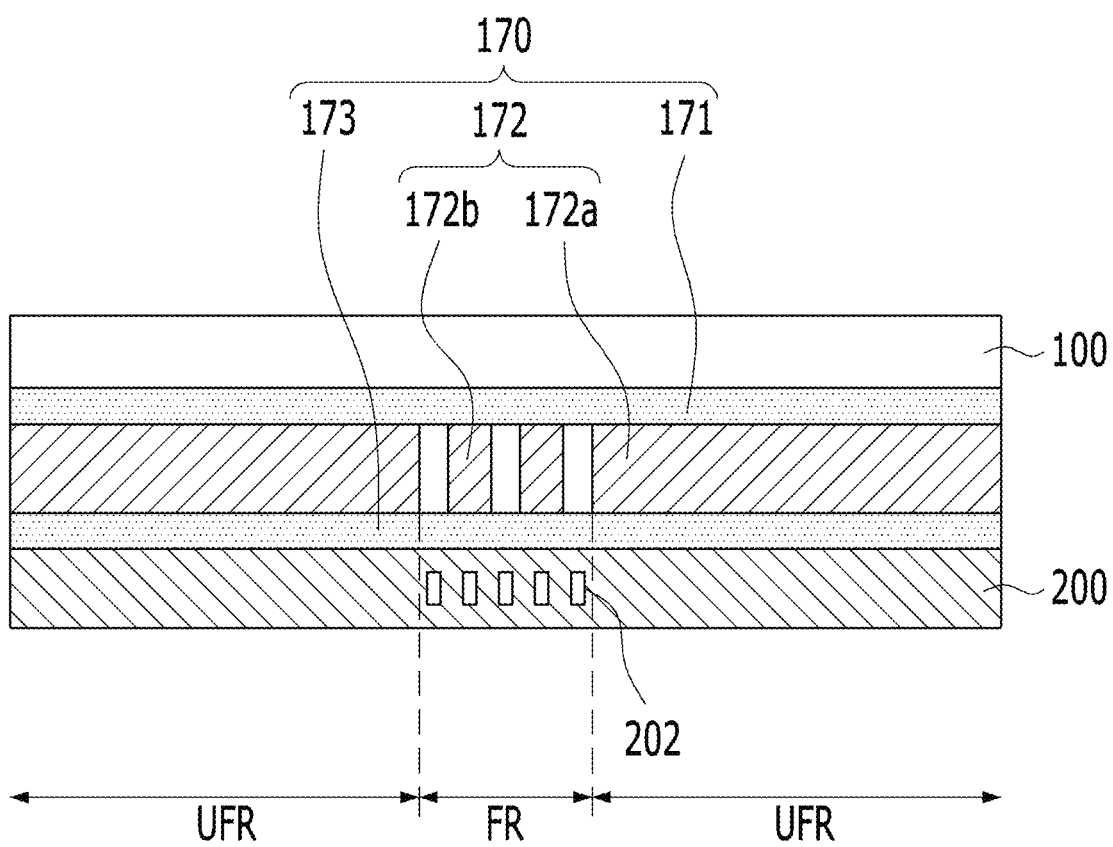
Figure 4:
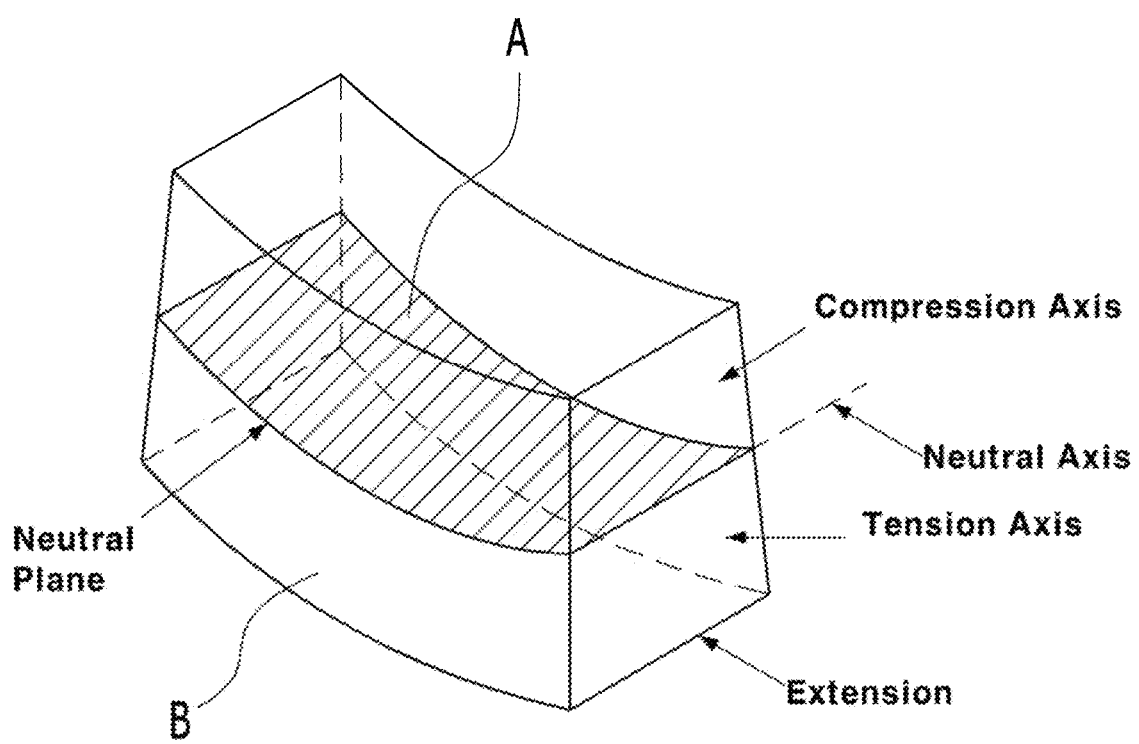
FIG. 4 is a three-dimensional view illustrating a neutral plane formed when applying compression and extension to an upper part and a lower part of a rectangular pattern, respectively, according to an example of the present invention.

FIGS. 3A to 3C are sectional views illustrating flexible displays to which various shapes of patterned adhesive according to examples of the present invention are applied. In addition, FIG. 4 is a three-dimensional view illustrating a neutral plane formed when applying compression and extension to an upper part and a lower part of a rectangular pattern, respectively, according to an example of the present invention.

As shown in FIG. 3A, a patterned adhesive 150 according to a first embodiment of the present invention includes a first adhesive layer 151 and a second adhesive layer 153 which contact the surfaces of the display panel 100 and the back plate 200 as the adherends, respectively, and further includes a patterned strain layer 152 including a rubber resin interposed between the first adhesive layer 151 and the second adhesive layer 153.

Here, the first adhesive layer 151 and the second adhesive layer 153 have the same size as the display panel 100 and the back plate 200, respectively, and are integrated, not divided or separated.

As mentioned above, the strain layer 152 includes, as a rubber resin, at least one of the following: a polybutadiene (PB) resin, a polyisobutylene (PIB) resin, a polypentadiene resin, a polyisoprene resin, a polyneoprene resin, styrene-butadiene rubber (SBR), acrylonitrile-butadiene rubber (NBR), an acrylonitrile-butadiene-styrene (ABS) resin, acrylate-butadiene rubber (ABR), ethylene-propylene rubber, ethylene-propylene-diene rubber, a combination thereof and a copolymer thereof.

In addition, the first and second adhesive layers 151 and 153 can be made of a binder resin including an adhesive ingredient and include a urethane acrylate resin or an epoxy resin as a base binder resin. For example, to synthesize a urethane acrylate resin, as acrylate-based compounds, 9 parts by weight of N-acryloyl morpholine, 8 parts by weight of isobornyl acrylate, 20 parts by weight of 2-phenoxy ethyl acrylate, 20 parts by weight of tetraethylene glycol diacrylate, and 10 parts by weight of tetraethylene glycol are added. In addition, in order to synthesize a urethane prepolymer, 19 parts by weight of polyether polyol, and 14 parts by weight of diphenylmethane diisocyanate (MDI) are added. Phenylbis(2,4,6-trimethyl benzoyl-phosphine oxide), which is a long-wavelength (405 nm) initiator, is added as a photoinitiator to cure the acrylate compound.

Here, the first and second adhesive layers 151 and 153 are mentioned as examples and can be changed to other materials that have an adhesive property and have low modulus not to apply stress to the curve of the adherend.

In the patterned adhesive 150 according to the first embodiment of the present invention, the first and second adhesive layers 151 and 153 have the same low strength, and the strain layer 152 has a higher strength than those of the first and second adhesive layers 151 and 153. The modulus of components constituting the patterned adhesive 150 will be described later. When considering the fact that the patterned strain layer 152 contributes to formation of a plurality of neutral planes, it is preferable that the strain layer 152 has a modulus of $1.0 \times 10^5$ Pa to $9.0 \times 10^7$ Pa, and the first and second adhesive layers 151 and 153 have a modulus of $1.0 \times 10^5$ Pa or less.

In addition, the patterned adhesive 150 according to the first embodiment of the present invention can be formed by forming the first adhesive layer 151 or the second adhesive layer 153 on any one surface of the substrate 100 or the back plate 200 and then patterning the strain layer 152 thereon such that the strain layer 152 is divided into separate parts spaced from one another.

Here, it is preferable that the height (a) of the strain layer 152 is larger than a critical dimension (corresponding to the horizontal length b in the illustrated structure) of a plane where the strain layer 152 faces the second adhesive layer 153, since there is an advantage in formation of a plurality of neutral planes.

In addition, it is advantageous for formation of neutral planes when a first distance (d) between adjacent two strain layers 152 is larger than the horizontal length (b) of the strain layer 152.

Meanwhile, as shown in FIG. 4, the neutral plane, for example, preferably means a plane, where neither shrinkage (compression) nor tension is generated between an upper surface A and a lower surface B, when shrinkage is applied to the upper surface A of a rectangular pattern and extension (tension) is applied to the lower surface B thereof. In FIG. 4, the neutral plane is shown as a hatched area between the upper surface A and the lower surface B. In addition, the neutral axis is defined along the area where the neutral plane is formed. The neutral axis is disposed between the compression axis and the tension axis.

That is, the formation of a plurality of neutral planes in the patterned adhesive 150 according to an embodiment of the present invention can mean that a plurality of shape-retaining parts are formed when attractive force upon folding or the like is applied to the patterned adhesive 150 between the adherends 100 and 200, which indicates that it is easy for the patterned adhesive 150 to return to the original state due to less strain of the patterned adhesive 150.

FIG. 3B shows a patterned adhesive 160 according to a second embodiment of the present invention. The patterned adhesive 160 includes a first adhesive layer 161, a strain layer 162 and a second adhesive layer 163. The first adhesive layer 161 is patterned in the same manner as the strain layer 162. The patterned adhesive 160 according to the second embodiment of the present invention is, for example, formed by forming the second adhesive layer 163 over the entire surface of the back plate 200, sequentially depositing a strain layer material and an adhesive layer material thereon and then division-patterning the same with the same mask to sequentially form a strain layer 162 and a first adhesive layer 161.

In this case, the first adhesive layer 161 is divided into a plurality of portions, and each first surface of the divided portions of the first adhesive layer 161 has the same size as each top surface of the plurality of spaced-apart divided strain layers 162. Sometimes the second adhesive layer 163 facing the back plate 200 are also patterned according to the plurality of spaced-apart divided strain layers 162.

In addition, by changing the shape and location of the patterned adhesive layer shown in FIG. 3B, the second adhesive layer 163 contacting the back plate 200 can be patterned and the first adhesive layer 161 can be formed over the entire surface of the display panel 100 in the shape corresponding to the display panel 100.

In addition, regarding the patterned adhesive 160 of the second embodiment according to the present invention, the size and disposition behavior of the strain layer 162 are the same as those of the patterned adhesive 150 of the first embodiment and detailed explanation thereof is thus omitted.

Meanwhile, regarding the first and second embodiments according to the present invention, adhesive layers 151, 153 and 163 formed over the entire surface of the panel 100 or back plate 200 can be omitted. When both the first adhesive layer 151 and the second adhesive layer 153 are omitted in the first embodiment, the strain layer 152 can include a material having adhesive property to the surfaces thereof which face the display panel 100 and the back plate 200, respectively.

Meanwhile, referring to FIG. 3C, a patterned adhesive 170 according to a third embodiment of the present invention includes a stain corresponding to the strain of the folding region (FR) of the back plate 200.

That is, as shown in FIG. 3C, the patterned adhesive 170 according to the third embodiment of the present invention includes a strain layer 172a which is formed in an integrated form, rather than being division-patterned, in an unfolding region (UFR) and a strain layer 172b divided into separate parts only in a folding region (FR). That is, the strain layer 172 has different shapes 172a and 172b in the folding region (FR) and the unfolding region (UFR). In this case, a plurality of neutral planes can be formed in the folding region (FR).

Meanwhile, the patterned adhesive 170 according to the third embodiment of the present invention shown in FIG. 3C includes first and second adhesive layers 171 and 173 on top and bottom surfaces of the strain layer 172. However, the present invention is not limited thereto and only one of the first and second adhesive layers 171 and 173 can be provided. In addition, at least one of the first and second adhesive layers 171 and 173 can be patterned in the same shape as the strain layer 172a.

In addition, as described above, in the flexible display according to the embodiment(s) of the present invention, the back plate 200 can include a plurality of openings 202 for flexible operation in the folding region (FR). In some cases, the strain layer 172 and the opening 202 of the patterned adhesive 170 can be controlled in proportion to each other.

Hereinafter, the first distance between adjacent strain layers 172 will be described with reference to a perspective view.

Figure 5:
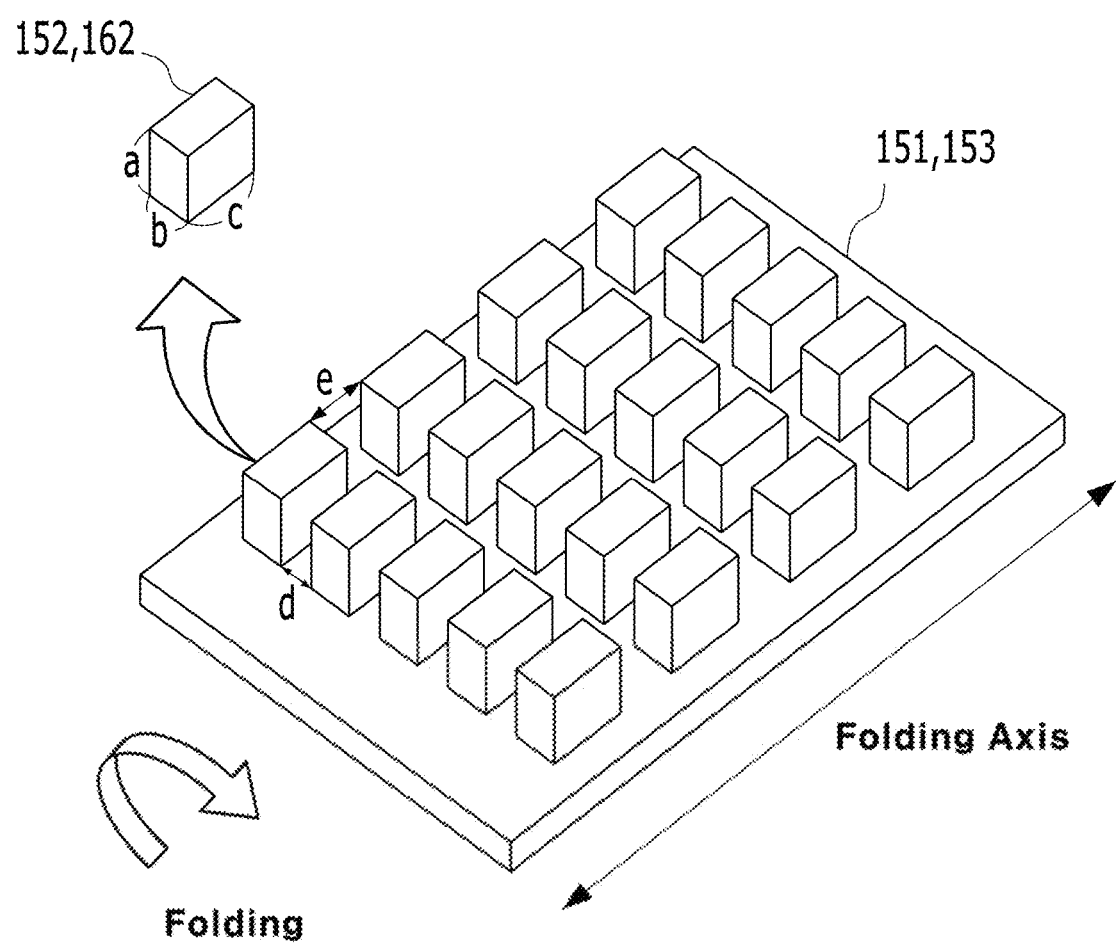
FIG. 5 is a perspective view illustrating a patterned adhesive according to the present invention.

FIG. 5 is a perspective view illustrating a patterned adhesive according to the present invention.

As shown in FIG. 5, the strain layers 152 and 162 of the patterned adhesives according to the first and second embodiments can each take the shape of a polygon including a rectangular shape, a cylinder or an elliptical cylinder. FIG. 5 shows a rectangular shape as an example of the strain layers 152 and 162. However, experimentation proves that it is effective for formation of a plurality of neutral planes that the patterned strain layers 152 and 162 be designed to have a longer length in one direction, or greater one height than another height of the bottom surface, so that orientation can be imparted thereto, rather than to take the shape of a regular hexahedron having identical width, length and height, or a cylinder having an identical radius on one plane. In this case, the top surfaces of the strain layers 152 and 162, which are spaced from each other, can take the shape of a long polygon or oval along the folding axis.

The rectangular strain layers 152 and 162, on a plane (xy plane) which contacts a first adhesive layer 151 or a second adhesive layer 153, has a "c" vertical length, in addition to the aforementioned horizontal length (b) (in the direction crossing the folding axis), and the vertical length (c) follows the folding axis. In addition, it is advantageous for effectively forming neutral planes that the vertical length (c) following the folding axis be larger than the horizontal length (b) crossing the folding axis.

In addition, it is advantageous to form plural neutral planes where the height (a) of the strain layers 152 and 162 is larger than a shorter horizontal length (b) among the bottom surfaces thereof.

In addition, experimentation proves that it is advantageous to form a plurality of neutral planes where the first distance (d) between horizontal lengths (b) between adjacent strain layers 152 and 162 is higher than or equal to the horizontal length (b). Here, the first distance (d) between the horizontal length (b) of the strain layers 152 and 162, and the horizontal length (b) of another adjacent strain layers 152 and 162 is disposed in the line along which folding is conducted. Meanwhile, there is a second distance (e) between adjacent strain layers 152 and 162 according to the folding axis. When folding is conducted, change of length between adjacent strain layers 152 and 162 can be happened in the direction crossing the folding axis, following change of the adherends. Therefore, it is important to set an initial first distance (d) between adjacent strain layers 152 and 162 at the non-folding state such that the first distance (d) can be variable following to change of the adherends at the folding state.

Figure 6:
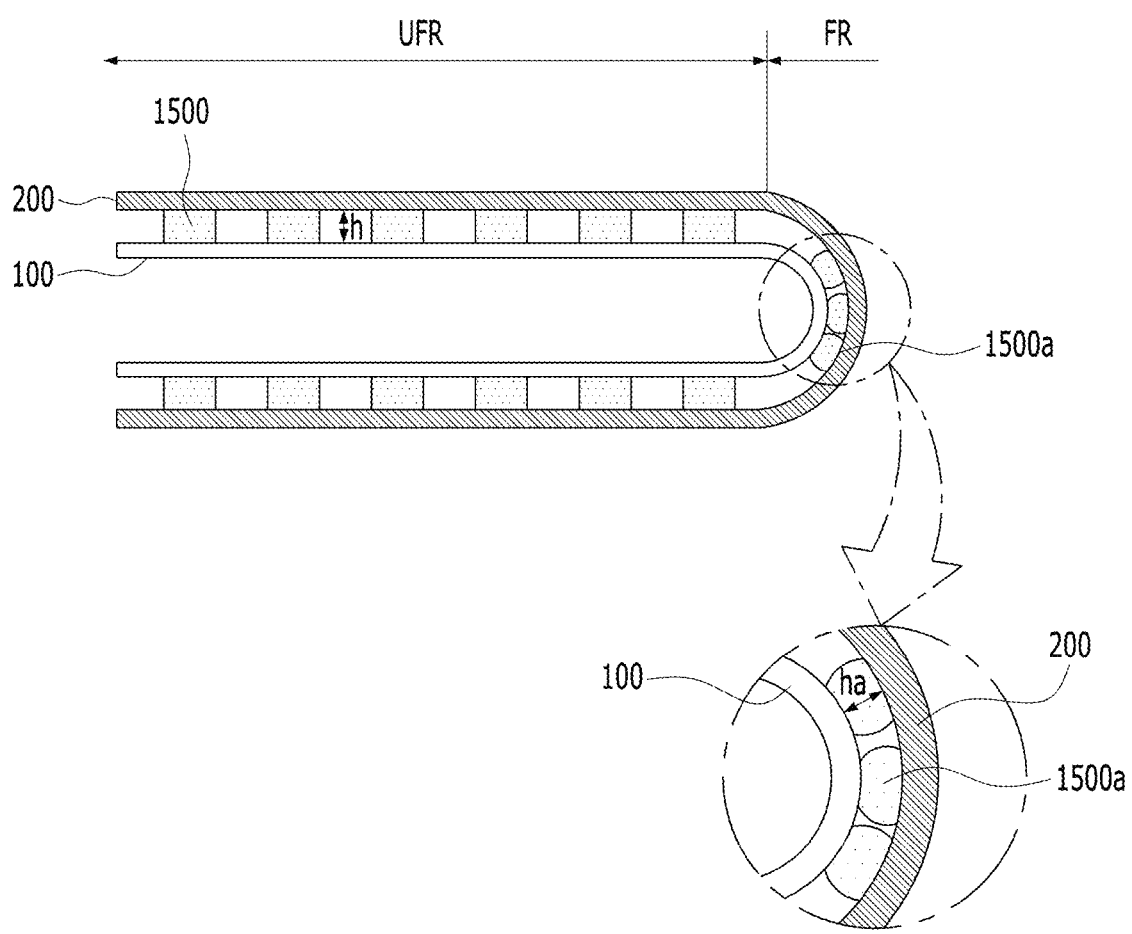
FIG. 6 is a sectional view illustrating a folding state of a flexible display according to an embodiment of the present invention.
Figure 7:
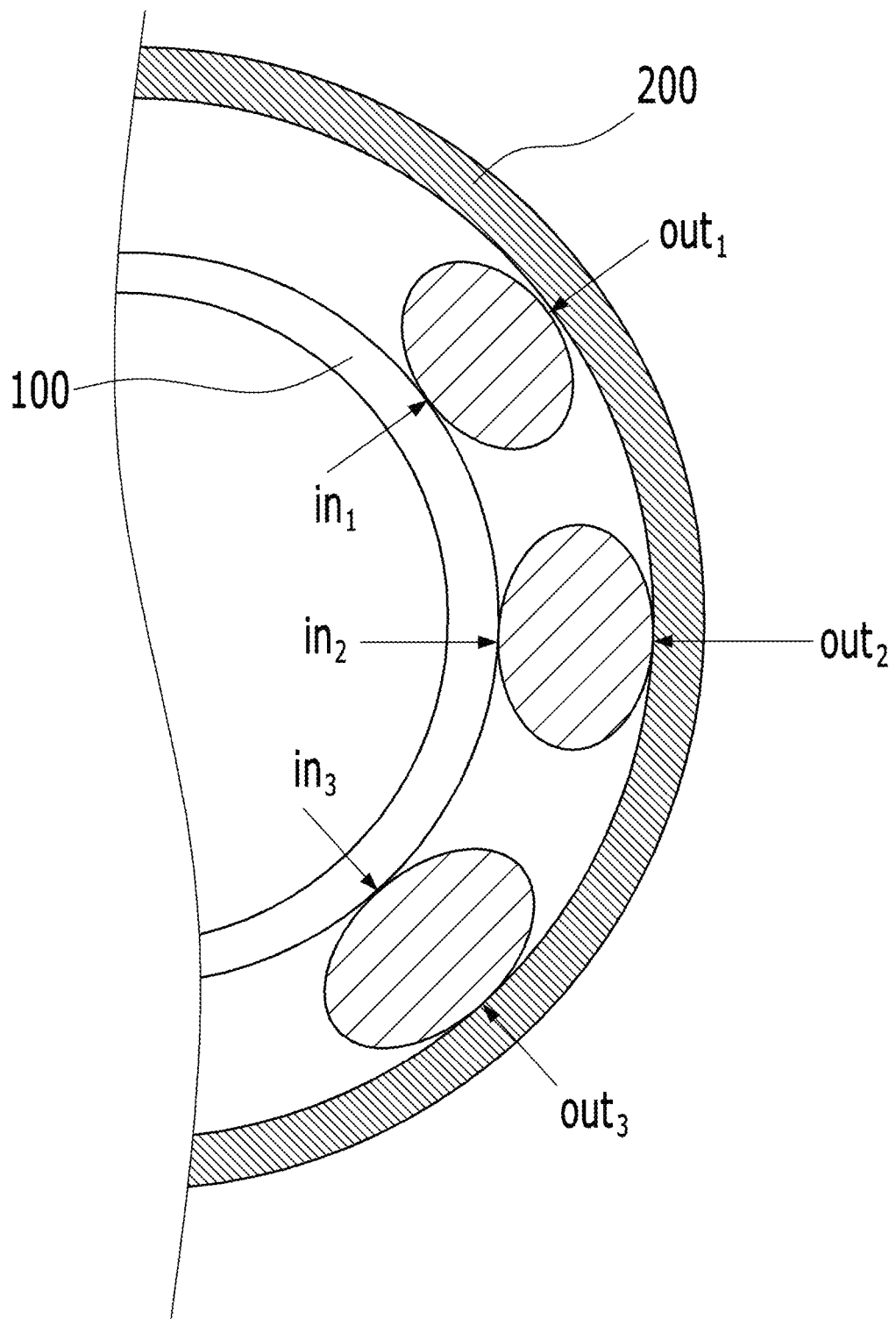
FIG. 7 is a sectional view illustrating a neutral plane in a folding region in the flexible display according to an embodiment of the present invention.

FIG. 6 is a sectional view illustrating a folding state of a flexible display according to an embodiment of the present invention and FIG. 7 is a sectional view illustrating a neutral plane in a folding region in the flexible display according to an embodiment of the present invention.

As shown in FIG. 6, regarding the flexible display according to the present invention, the patterned adhesive 1500a in the folding region (FR) where folding is conducted and curvature is created by folding is compressed upon folding, so the patterned adhesive 1500a has a smaller height (ha) than a height (h) of the adhesive 1500 in the unfolding region (UFR). As a result, the difference in strain between the inner-folded display panel 100 and the outer-folded back plate 200 can be reduced.

In addition, as shown in FIG. 7, when magnifying the folding region FR, a plurality of inner neutral planes (neutral plane in1, neutral plane in2, neutral plane in3) having no strain are formed in an area where the compressed patterned adhesive 1500a contacts the display panel 100, and a plurality of outer neutral planes (neutral plane out1, neutral plane out2, neutral plane out3) having no strain are formed in an area where the compressed patterned adhesive 1500a contacts the back plate 200. As a result, upon folding, the total strain of the patterned adhesive 1500a can be reduced through formation of plural neutral planes, and upon unfolding, the patterned adhesives 1500 and 1500a can be easily returned to the original state according to the display panel 100 and the back plate 200.

Figure 8A:
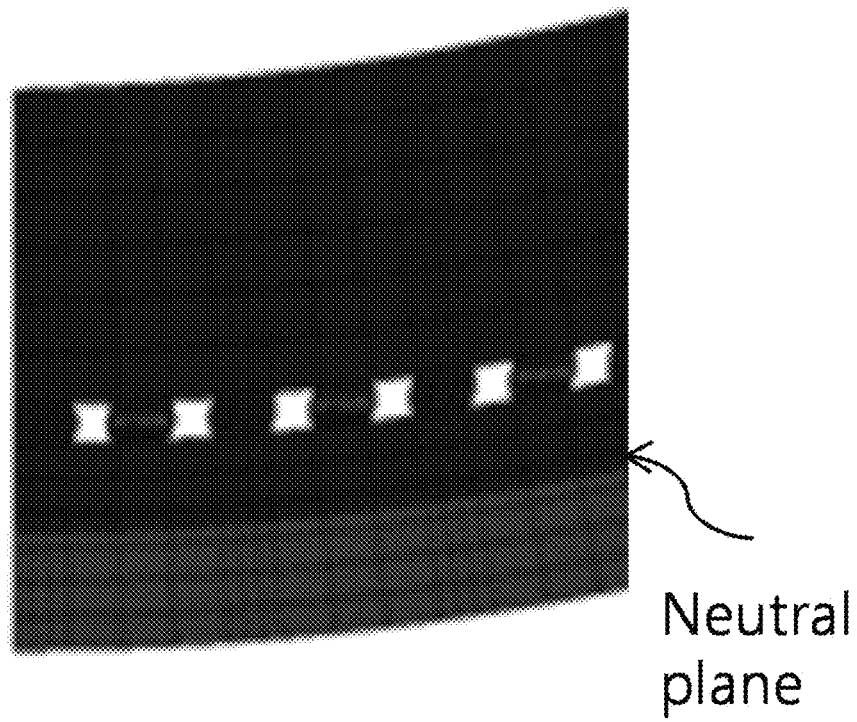
FIGS. 8A and 8B show formation of neutral planes depending on different moduli of the patterned adhesive.
Figure 8B:
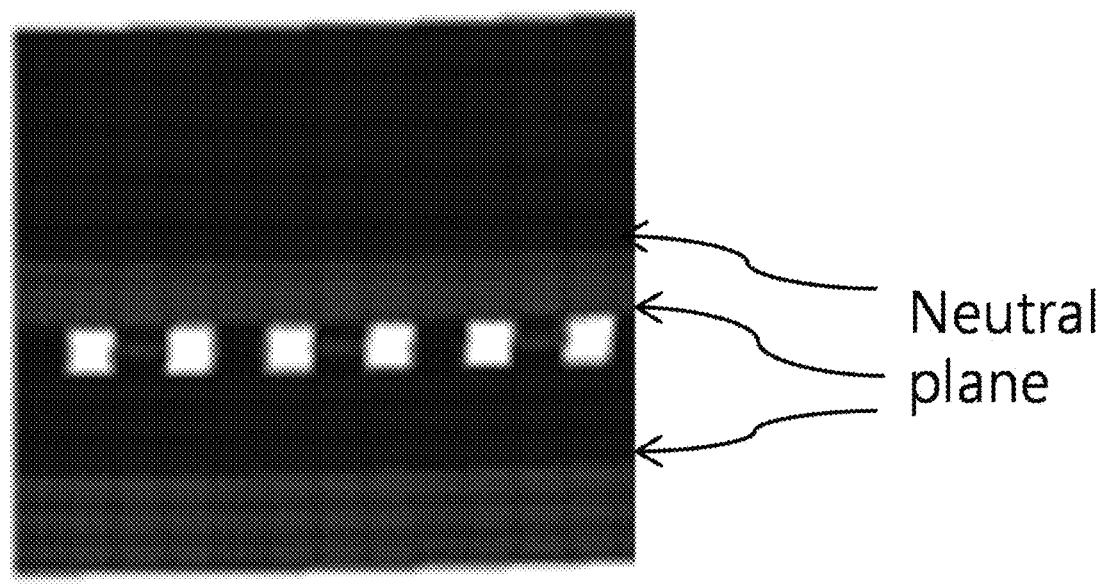

FIGS. 8A and 8B show formation of neutral planes depending on different moduli of the patterned adhesive.

FIGS. 8A and 8B show simulated neutral planes formed at different moduli ($1.0 \times 10^8$ Pa/$1.0 \times 10^7$ Pa) of the strain layer of the patterned adhesive. Neutral planes are formed at different colors of interfaces. As shown in FIG. 8A, when the material for the strain layer constituting the patterned adhesive has a high modulus of 1.0×108 Pa, one substantial neutral plane is formed. This means that, when the modulus of the material is very high, a patterned strain layer is provided and a neutral plane is not effectively formed.

On the other hand, as shown in FIG. 8B, when the material for the strain layer constituting the patterned adhesive has a high modulus of 1.0×107 Pa, three or more neutral planes are formed, and the effect of the patterned strain layer can be obtained from the patterned adhesive. That is, formation of a plurality of neutral planes prevents stress from concentrating on the folding region. Providing neutral planes in the display panel or back plate, which contacts the patterned adhesive, disperses stress during folding, thereby preventing relatively flexible display panels from cracking. In addition, in this case, the strain layer is compressively deformed upon receiving force caused by folding, and then returns to the original height upon removal of the force.

The material for the strain layer according to an example of the present invention will be described again below.

A material having a low modulus of less than 1.0×105 Pa can easily provide formation of a plurality of neutral planes due to the inherent flexibility of the material, although not patterned. In this case, the material is inapplicable to devices because it slowly returns to the original state after deformation upon receiving specific force. When, in actual, an adhesive having an un-patterned resin having a modulus of 1.0×105 Pa was provided, it took one day or longer to return the folded flexible display to the original un-folded (open) state.

Like the patterned adhesive according to the present invention, when the patterned adhesive is formed using a material (rubber resin) for a strain layer having a modulus of 1.0×105 Pa to 9.0×107 Pa, stress upon folding is low due to formation of a plurality of neutral planes, and it can easily return to the original state due to higher modulus (1.0×105 Pa to 9.0×107 Pa) than general adhesives.

Figure 9:
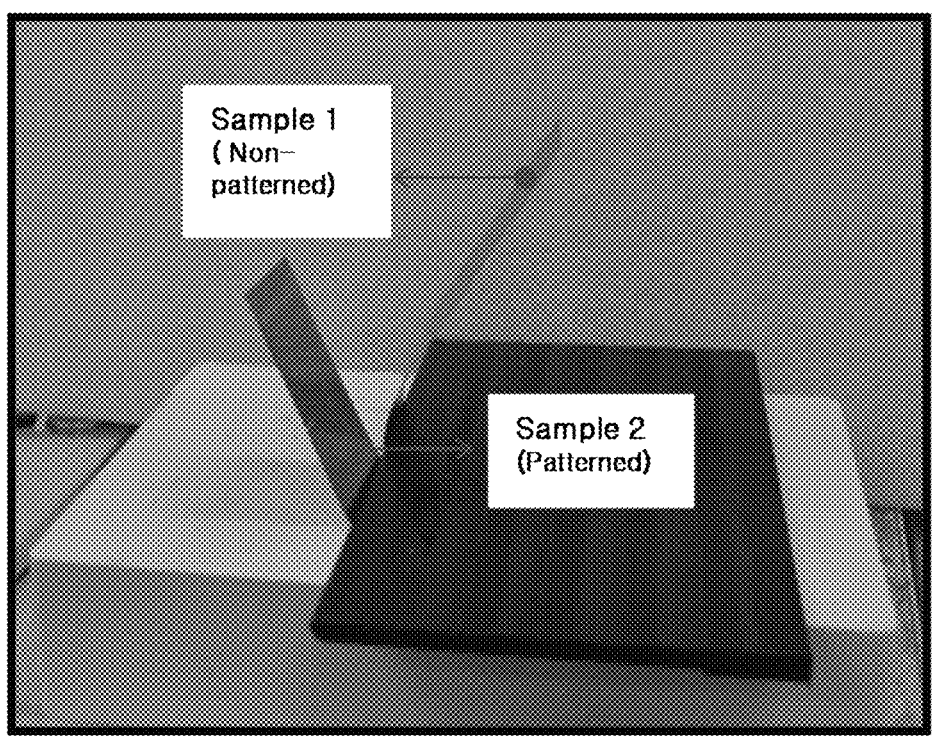
FIG. 9 is an image showing a state immediately after removal of a predetermined force applied upon applying patterned adhesive and an entire-surface-type adhesive to an adherend.

FIG. 9 is an image showing a state immediately after removal of a predetermined force applied upon applying patterned adhesive and an entire-surface-type adhesive to an adherend.

As shown in FIG. 9, Sample 1 shows the entire-surface-type adhesive and Sample 2 shows the patterned adhesive according to an example of the present invention. It can be seen that, after removal of applied force, the patterned adhesive according to the present invention forms an obtuse angle with a base substrate. That is, the patterned adhesive according to the present invention, which faces the base substrate upon folding, can spontaneously return to the original state rapidly, in spite of not receiving additional force.

On the other hand, when the entire-surface-type adhesive of Sample 1 is applied, it forms an acute angle with the base substrate after removal of applied force, which means that it is difficult for the patterned adhesive to return to the original state after folding.

As described above, the patterned adhesive according to the embodiments of the present invention can disperse stress applied to the adherend through formation of a plurality of neutral planes when attractive force caused by folding is applied between both adherends.

In addition, the patterned adhesive is formed by patterning a compressive-deformable rubber resin, thereby easily returning to the original state after removal of folding attraction.

In addition, by dispersing attractive force during folding through the patterned adhesive, the problem of cracks of the relatively flexible display panel can be prevented or minimized, although the patterned adhesive is formed using a material with high modulus.

Meanwhile, it is preferable that, regarding the patterned adhesive according to the embodiments of the present invention, the thickness of one or two sides of the adhesive layer contacting the strain layer is kept to be smaller than that of the strain layer. The reason for this is that the patterned adhesive can secure sufficient neutral planes, which disperse stress of extension and shrinkage during folding, while offering adhesion between both adherends.

In addition, regarding the patterned adhesive according to the embodiments of the present invention, the total thickness of the patterned adhesive including the strain layer and one or two sides of the adhesive layer which contacts the strain layer is maintained to a level of about 50 μm or less, so that separately divided strain layers spaced from one another as well as surface steps between the distances therebetween are visible.

The adhesive and the flexible display including the same according to the embodiments of the present invention have the following effects and advantages.

First, when attraction caused by folding is applied between two adherends, a plurality of neutral planes are formed by providing a patterned adhesive, so that stress applied to the adherends can be dispersed.

Second, an adhesive patterned with a compressive deformable rubber resin is formed, thereby easily returning to the original state after removal of folding attraction.

Third, by dispersing folding attraction through the patterned adhesive, cracks of the relatively flexible display panel can be prevented although the patterned adhesive is formed of a material having a high modulus.

In addition, although the preferred embodiments of the present invention have been disclosed for illustrative purposes with reference to the annexed drawings, it will be apparent to those skilled in the art that the present invention is not limited to the same configurations, actions and effects as the specific embodiments, and various modifications and variations can be made in the present invention without departing from the spirit or scope of the invention. Accordingly, it is intended that such modifications and alterations fall within the scope of the present invention and the true technical protection scope of the invention is defined by the technical spirit of the appended claims.

What is claimed is:

1. An adhesive interposed between a first adherend and a second adherend facing each other, the adhesive comprising:
   a strain layer comprising a plurality of spaced-apart divided strain layers, each spaced-apart divided strain layer having a polygonal top surface along a folding axis; and
   a first adhesive layer having a first surface contacting the top surface of the strain layer and a second surface contacting the first adherend,
   wherein each of the spaced-apart divided strain layers has the top surface, a bottom facing the second adherend, and a height between the top surface and the bottom surface,
   wherein the top surface and the bottom surface have a first side along the folding axis and a second side crossing the first side, and the height is longer than the second side, and
   wherein a distance between second sides of two adjacent spaced-apart divided strain layers is larger than or equal to a length of the second side.

2. The adhesive according to claim 1, wherein the first adhesive layer is integrated with the first adherend, while having the same size as the first adherend corresponding to the second surface.

3. The adhesive according to claim 1, wherein the first adhesive layer is divided into a plurality of portions, and each first surface of the divided portions of the first adhesive layer has the same size as each top surface of the plurality of spaced-apart divided strain layers.

4. The adhesive according to claim 1, further comprising:
a second adhesive layer disposed between the strain layer and the second adherend.

5. The adhesive according to claim 1, wherein the strain layer has a modulus of approximately $1.0 \times 10^5$ Pa to $9.0 \times 10^7$ Pa.

6. The adhesive according to claim 4, wherein the strain layer comprises a rubber resin, and
wherein the first adhesive layer and the second adhesive layer comprise a binder resin.

7. A flexible display comprising:
a display panel comprising a thin film transistor, an organic light emitting diode array, and a sealing layer for sealing the thin film transistor and the organic light emitting diode array;
a back plate facing the display panel and comprising a folding region and an unfolding region; and
an adhesive provided between the display panel and the back plate,
wherein the adhesive comprises:
a strain layer interposed between the display panel and the back plate facing each other, the strain layer including a plurality of spaced-apart divided strain layers, each spaced-apart divided strain layer having a polygonal top surface along a folding axis, and
a first adhesive layer having a first surface contacting the top surface of the strain layer and a second surface contacting the display panel,
wherein each of the spaced-apart divided strain layers has the top surface, a bottom surface facing the back plate, and a height between the top surface and the bottom surface,
wherein the top surface and the bottom surface have a first side along the folding axis and a second side crossing the first side, and
wherein a distance between second sides of two adjacent spaced-apart divided strain layers is larger than or equal to a length of the second side.

8. The flexible display according to claim 7, wherein the back plate comprises a plurality of openings in the folding region.

9. The flexible display according to claim 8, wherein the spaced-apart divided strain layers comprise:
a first pattern corresponding to an area of the unfolding region of the back plate, and
a plurality of second patterns disposed apart from the first pattern in the folding region of the back plate such that the second patterns are spaced from one another by a predetermined distance.

10. The flexible display according to claim 7, wherein the height of each of the spaced-apart divided strain layers is longer than the second side.

11. The adhesive according to claim 1, wherein the height of each of the spaced-apart divided strain layers is longer than the second side, and the first adhesive layer is divided into a plurality of portions.

12. The adhesive according to claim 1, wherein the first side of each of the spaced-apart divided strain layers is longer than the second side.

13. The adhesive according to claim 1, wherein the spaced-apart divided strain layers are arranged in a same plane and there is space among the spaced-apart divided strain layers.

14. The adhesive according to claim 1, wherein at least one of the spaced-apart divided strain layers is compressed and adjacent space to the compressed at least one of the spaced-apart divided strain layers is reduced in a folding region than in an unfolding region, upon folding.

15. The flexible display according to claim 7, wherein the first side of each of the spaced-apart divided strain layers is longer than the second side.

16. The flexible display according to claim 7, wherein the spaced-apart divided strain layers are arranged in a same plane and there is space among the spaced-apart divided strain layers.

17. The flexible display according to claim 7, wherein at least one of the spaced-apart divided strain layers is compressed and adjacent space to the compressed at least one of the spaced-apart divided strain layers is reduced in a folding region than in an unfolding region, upon folding.

* * * * *